United States Patent
Yoon et al.

(10) Patent No.: US 11,754,510 B2
(45) Date of Patent: Sep. 12, 2023

(54) INSPECTION SYSTEM OF SEMICONDUCTOR WAFER AND METHOD OF DRIVING THE SAME

(71) Applicant: SAMSUNG ELECTRONICS CO., LTD., Suwon-si (KR)

(72) Inventors: Doyoung Yoon, Suwon-si (KR); Jeongho Ahn, Suwon-si (KR); Dongryul Lee, Suwon-si (KR); Dongchul Ihm, Suwon-si (KR); Chungsam Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/501,318

(22) Filed: Oct. 14, 2021

(65) Prior Publication Data
US 2023/0123710 A1    Apr. 20, 2023

(51) Int. Cl.
*G01N 21/95* (2006.01)
*H01L 21/66* (2006.01)
*G01N 21/88* (2006.01)
*G01N 21/956* (2006.01)

(52) U.S. Cl.
CPC ..... *G01N 21/9501* (2013.01); *G01N 21/8806* (2013.01); *G01N 21/956* (2013.01); *H01L 22/12* (2013.01)

(58) Field of Classification Search
CPC .......... G01N 21/9501; G01N 21/8806; G01N 21/956; H01L 22/12
See application file for complete search history.

(56) References Cited

U.S. PATENT DOCUMENTS

| 5,990,016 | A | 11/1999 | Kim et al. |
| 7,156,951 | B1 | 1/2007 | Gao et al. |
| 7,226,488 | B2 * | 6/2007 | Gat .................. H01L 21/67115 29/25.01 |
| 8,310,667 | B2 * | 11/2012 | Zama ................. G01N 21/9501 356/237.4 |
| 9,646,893 | B2 * | 5/2017 | Dickerson ............. H01L 21/324 |
| 2002/0092471 | A1 | 7/2002 | Kang et al. |

(Continued)

FOREIGN PATENT DOCUMENTS

| JP | 1997-127006 | 5/1997 |
| JP | 2012-216752 | 11/2012 |

(Continued)

OTHER PUBLICATIONS

Notice of Allowance dated Dec. 6, 2022 in corresponding KR Patent Application No. 10-2018-0107843.

*Primary Examiner* — Hung V Nguyen
(74) *Attorney, Agent, or Firm* — F. Chau & Associates, LLC

(57) ABSTRACT

A semiconductor wafer inspection system includes a wafer chuck disposed inside a chamber and on which a wafer is disposed, a light source configured to emit light for inspecting a pattern on the wafer to the wafer, an inspection controller configured to control the driving of the light source, a cooling gas gun disposed adjacent to the light source and configured to spray a cooling gas on a surface of the wafer, and a cooling controller configured to supply cooling air to the wafer chuck before light is emitted to the wafer and supply the cooling gas to the cooling gas gun.

16 Claims, 5 Drawing Sheets

(56) References Cited

U.S. PATENT DOCUMENTS

2012/0122252 A1   5/2012  Fujimori
2016/0328840 A1  11/2016  Kiss et al.

FOREIGN PATENT DOCUMENTS

| | | |
|---|---|---|
| JP | 2015-179738 | 10/2015 |
| JP | 2016-025242 | 2/2016 |
| JP | 2018-006509 | 1/2018 |
| KR | 10-2004-0026861 | 4/2004 |
| KR | 10-2013-0072730 | 7/2013 |
| KR | 10-2013-0141518 | 12/2013 |
| KR | 10-1626475 | 6/2016 |
| KR | 10-2018-0003407 | 1/2018 |

\* cited by examiner

| Cooling target | Set temperature | Cooler | Driving time |
|---|---|---|---|
| Wafer chuck | −10°C to +10°C | Driving of first cooler | Within 10 min. before inspection begins |
| Inside of chamber | −10°C to +10°C | Driving of second cooler | Within 10 min. before inspection begins |
| Surface of wafer | −10°C or lower | Driving of third cooler | Spray cooling gas 10 sec. before inspection light is emitted |

INSPECTION SYSTEM OF SEMICONDUCTOR WAFER AND METHOD OF DRIVING THE SAME

BACKGROUND

1. Field

Systems and methods consistent with example embodiments relate to an inspection system of semiconductor wafers (hereinafter, referred to as a semiconductor wafer inspection system) and a method of driving the same, which may improve failure detection performance in an after-develop inspection (ADI) process during a semiconductor manufacturing process.

2. Description of Related Art

There is an increasing demand for the detection of failures using an after-develop inspection (ADI) process which may be reworked during a semiconductor manufacturing process. During the ADI process, light is emitted to a surface of a wafer to inspect whether a pattern has been normally formed on the wafer. The wafer and photoresist (PR) remaining on the surface of the wafer may be deformed due to the light emitted to the wafer, thereby lowering failure detection performance.

SUMMARY

The example embodiments of the inventive concept are directed to providing a semiconductor wafer inspection system and a method of driving the same, which may prevent the deformation of a wafer and photoresist (PR) due to light emitted to the wafer during an after-develop inspection (ADI) process and improve failure detection performance.

According to example embodiments, there is provided a semiconductor wafer inspection system including a wafer chuck disposed inside a chamber and on which a wafer is disposed, a light source configured to emit light to the wafer so as to inspect a pattern on the wafer, an inspection controller configured to control driving of the light source, a cooling gas gun disposed adjacent to the light source and configured to spray a cooling gas on a surface of the wafer, and a cooling controller configured to supply cooling air to the wafer chuck before light is emitted to the wafer and supply the cooling gas to the cooling gas gun.

According to example embodiments, there is provided a semiconductor wafer inspection system including a wafer chuck disposed inside a chamber and on which a wafer is disposed, a light source configured to emit light to the wafer for inspecting a pattern on the wafer, an inspection controller configured to control driving of the light source, a cooling gas gun disposed adjacent to the light source and configured to spray a cooling gas on a surface of the wafer, and a cooling controller configured to supply cooling air to the inside of the chamber and supply the cooling gas to the cooling gas gun before light is emitted to the wafer.

According to example embodiments, there is provided a semiconductor wafer inspection system including a wafer chuck disposed inside a chamber and on which a wafer is disposed, a light source configured to emit light to the wafer for inspecting a pattern on the wafer, an inspection controller configured to control driving of the light source, a cooling gas gun disposed adjacent to the light source and configured to spray a cooling gas on a surface of the wafer, a cooling controller configured to supply cooling air to the wafer chuck and an inside of the chamber and supply a cooling gas to the cooling gas gun before light is emitted to the wafer, a first temperature sensor configured to measure a temperature of the wafer chuck, generate a first temperature value, and transmit the first temperature value to the cooling controller, and a second temperature sensor configured to measure an inner temperature of the chamber, generate a second temperature value, and transmit the second temperature value to the cooling controller.

DETAILED DESCRIPTION OF EXEMPLARY EMBODIMENTS

Hereinafter, a semiconductor wafer inspection system and a method of driving the same, according to example embodiments of the inventive concept, will be described with reference to the accompanying drawings.

Figure 1:
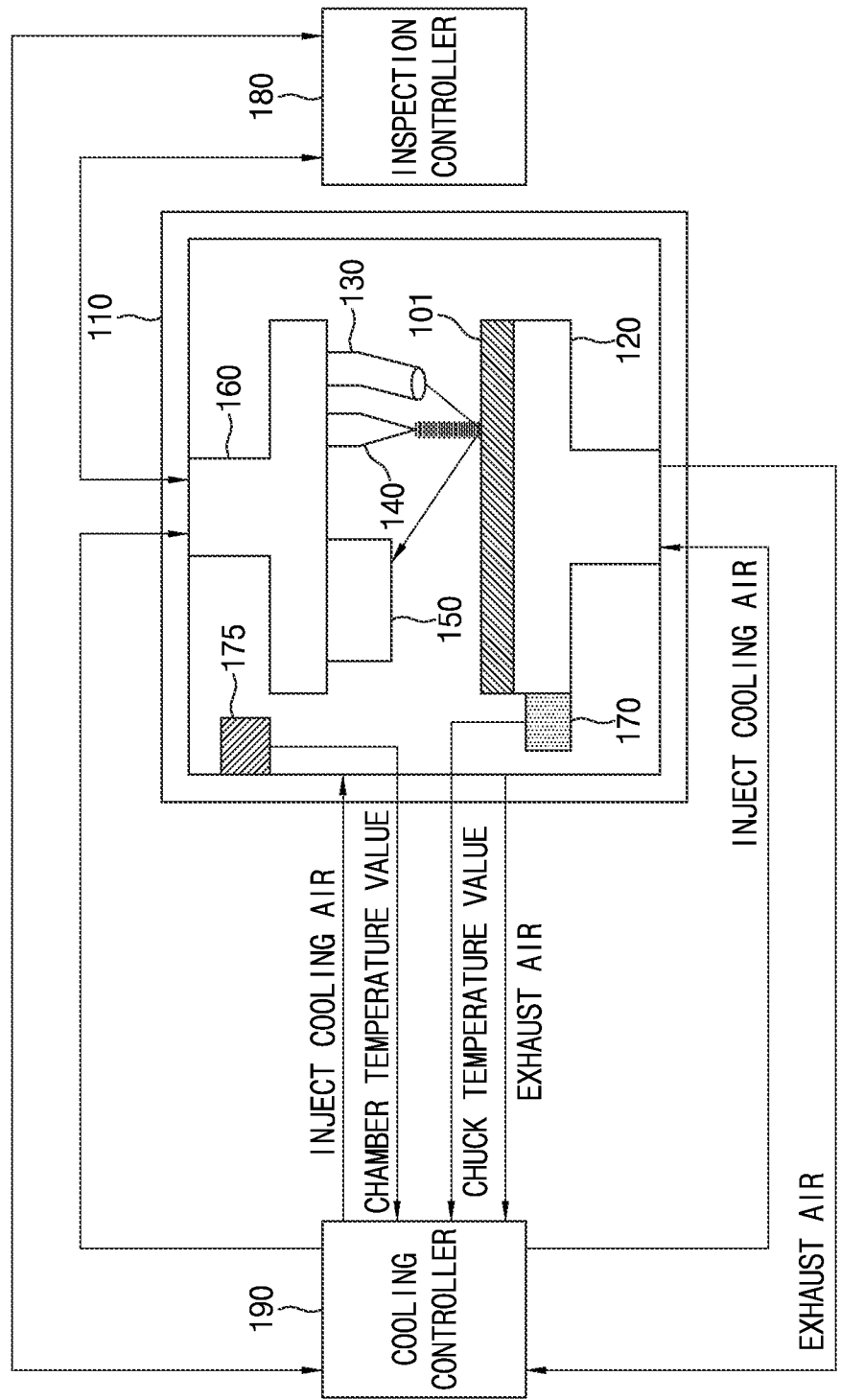
FIG. 1 is a diagram illustrating a semiconductor wafer inspection system 100 according to example embodiments of the inventive concept.

FIG. 1 is a diagram illustrating a semiconductor wafer inspection system 100 according to example embodiments of the inventive concept.

Referring to FIG. 1, the semiconductor wafer inspection system 100 according to the example embodiments of the inventive concept may include a chamber 110, a wafer chuck 120, a light source 130, a cooling gas gun 140, a vision camera 150, a transfer unit 160, a first temperature sensor 170, a second temperature sensor 175, an inspection controller 180, and a cooling controller 190.

The semiconductor wafer inspection system 100 according to the example embodiments of the inventive concept may inspect whether a pattern has been normally formed on a surface of a wafer 101. The inspection of the pattern on the wafer 101 using the semiconductor wafer inspection system 100 may be performed during an after-develop inspection (ADI) operation.

A predetermined space may be prepared inside the chamber 110, and the wafer chuck 120, the light source 130, the cooling gas gun 140, the vision camera 150, and the transfer unit 160 may be disposed in the predetermined space.

A predetermined pressure may be applied into the chamber 110 during a manufacturing process, and a chemical material and a gas may be injected according to each manufacturing process. A heating unit configured to heat the inside of the chamber 110 to a predetermined temperature may be disposed.

A circulation line through which cooling air flows may be uniformly disposed in a lower surface of the wafer chuck 120. The cooling air may be injected into the circulation line to cool the wafer chuck 120. The wafer 101 may be disposed on an upper surface of the wafer chuck 120.

The light source 130, the cooling gas gun 140, and the vision camera 150 may be coupled to the transfer unit 160. The cooling gas gun 140 may spray a cooling gas locally before light is emitted to the wafer 101 and cool a region to be irradiated with light. The light source 130 and the cooling gas gun 140 may be disposed adjacent to each other within such a range as to not cause interference during the emission of light.

The inspection controller 180 may generate a transfer control signal and transmit the transfer control signal to the transfer unit 160. The transfer unit 160 may be transferred in response to the transfer control signal applied by the inspection controller 180. The light source 130, the cooling gas gun 140, and the vision camera 150 may be transferred by the transfer unit 160 to correspond to the entire region of the wafer 101. That is, to inspect the entire pattern formed on the surface of the wafer 101, the light source 130, the cooling gas gun 140, and the vision camera 150 may be transferred by the transfer unit 160 to correspond to the entire region of the wafer 101.

The inspection controller 180 and the cooling controller 190 may be synchronized with each other to inspect the pattern of the wafer 101. The inspection controller 180 and the cooling controller 190 may transmit and receive control signals to and from each other for synchronization. As an example, the inspection controller 180 may generate an inspection control signal for inspecting the pattern of the wafer 101 and transmit the generated inspection control signal to the cooling controller 190. As an example, the cooling controller 190 may lower a temperature of the wafer chuck 120 and an inner temperature of the chamber 110 to a preset temperature before the inspection of the pattern on the wafer 101 and generate a cooling control signal indicating whether a cooling condition has been satisfied. The cooling controller 190 may transmit the generated cooling control signal to the inspection controller 180.

Before the inspection of the pattern on the wafer 101 begins, the cooling controller 190 may lower the temperature of the wafer chuck 120 and the inner temperature of the chamber 110 to a preset temperature. The inner temperature of the chamber 110 may be lowered to the preset temperature so that a temperature of the surface of the wafer 101 disposed on the wafer chuck 120 may be lowered. The inspection controller 180 may start the inspection of the pattern on the wafer 101 after the temperature of the wafer chuck 120 and the inner temperature of the chamber 110 are lowered to the preset temperature. The cooling controller 190 may lower both the temperature of the wafer chuck 120 and the inner temperature of the chamber 110 to the preset temperature.

During the inspection of the pattern on the wafer 101, the inspection controller 180 may generate a light source control signal for driving the light source 130. The inspection controller 180 may transmit the generated light source control signal to the light source 130. During the inspection of the wafer 101, the light source 130 may be driven based on the light source control signal applied by the inspection controller 180. By driving the light source 130, light may be emitted to the surface of the wafer 101. The light source 130 may be moved by the transfer unit 160, and light may be emitted over the entire region of the wafer 101. The vision camera 150 may generate an inspection image corresponding to the light emitted to the surface of the wafer 101. The vision camera 150 may transmit the generated inspection image to the inspection controller 180.

The inspection controller 180 may display the inspection image, which is received from the vision camera 150, through a display device. The inspection controller 180 may determine whether the pattern has been normally formed on the surface of the wafer 101 based on the received inspection image and display a determination result.

To precisely inspect the pattern formed on the surface of the wafer 101, deformation of the wafer 101 and photoresist (PR) should be prevented. The inspection controller 180 may drive the transfer unit 160 and the light source 130 after the temperature of the wafer chuck 120 and the inner temperature of the chamber 110 are lowered to the preset temperature.

The first temperature sensor 170 may measure the temperature of the wafer chuck 120 and generate a first temperature value (e.g., a temperature value of the wafer chuck 120). The first temperature sensor 170 may transmit the generated first temperature value to the cooling controller 190. The inventive concept is not limited thereto, and a plurality of first temperature sensors 170 may be uniformly disposed on the entire region of the wafer chuck 120 to precisely measure a temperature of the entire region of the wafer chuck 120. Each of the plurality of first temperature sensors 170 may generate the first temperature value. Each of the plurality of first temperature sensors 170 may transmit the generated first temperature value to the cooling controller 190.

The second temperature sensor 175 may measure the inner temperature of the chamber 110 and generate a second temperature value (e.g., an inner temperature value of the chamber 110). The second temperature sensor 175 may transmit the generated second temperature value to the cooling controller 190. The inventive concept is not limited thereto, and a plurality of second temperature sensors 175 may be uniformly disposed on the entire region of the chamber 110 to precisely measure a temperature of the entire region of the inside of the chamber 110. Each of the plurality of second temperature sensors 175 may generate the second temperature value. Each of the plurality of second temperature sensors 175 may transmit the generated second temperature value to the cooling controller 190.

Figure 2:
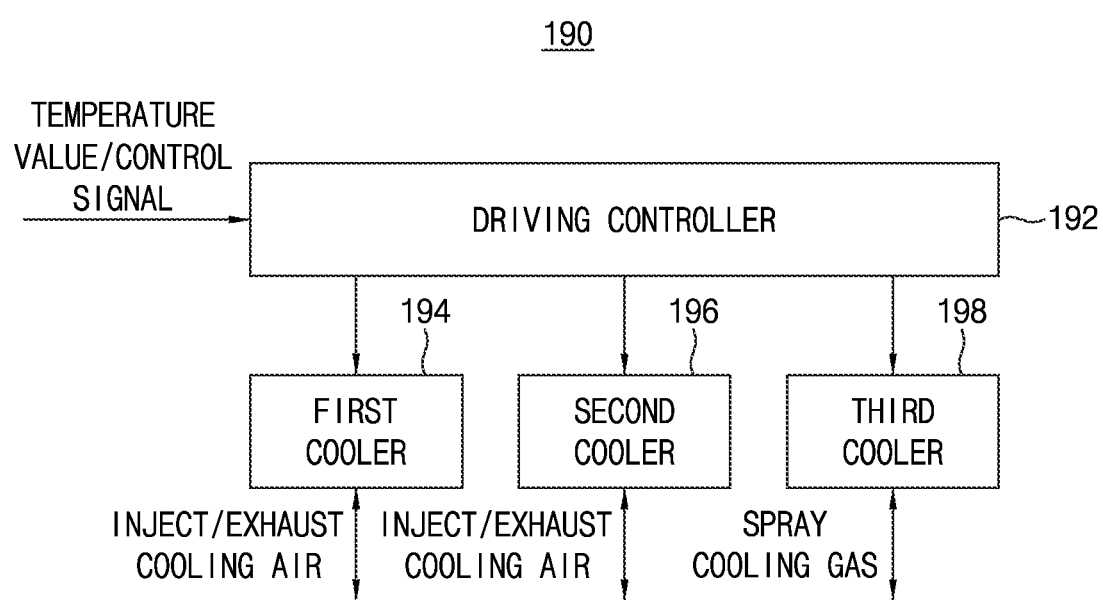
FIG. 2 is a diagram illustrating the cooling controller 190 shown in FIG. 1.

FIG. 2 is a diagram illustrating the cooling controller 190 shown in FIG. 1.

Referring to FIG. 2, the cooling controller 190 may include a driving controller 192, a first cooler 194, a second cooler 196, and a third cooler 198.

The first cooler 194 may be connected to the wafer chuck 120 by a first supply line into which cooling air is injected. The first cooler 194 may be driven via the control of the driving controller 192 and generate cooling air. The cooling air generated by the first cooler 194 may be supplied to the circulation line of the wafer chuck 120 through the first supply line. The first cooler 194 may lower a temperature of clean dry air (CDA), which is a clean gas, and generate cooling air. The first cooler 194 and the wafer chuck 120 may be connected to a first exhaust line. After the cooling air injected into the wafer chuck 120 is circulated by the circulation line, the cooling air may be exhausted to the first cooler 194 by the first exhaust line.

The second cooler 196 may be connected to the chamber 110 by a second supply line into which cooling air is injected. The second cooler 196 may be driven via the control of the driving controller 192 and generate cooling air. The cooling air generated by the second cooler 196 may be supplied into the chamber 110 through the second supply line. The second cooler 196 may lower a temperature of CDA, which is a clean gas, and generate cooling air. The second cooler 196 and the chamber 110 may be connected to a second exhaust line. After the cooling air injected into the chamber 110 is circulated, the cooling air may be exhausted to the second cooler 196 by the second exhaust line.

The third cooler 198 may be connected to the cooling gas gun 140 by a third supply line into which cooling air is injected. The third cooler 198 may be driven via the control of the driving controller 192 and generate a cooling gas. The cooling gas generated by the third cooler 198 may be supplied to the cooling gas gun 140 through the third supply line.

The cooling gas gun 140 may compress the cooling gas supplied by the third cooler 198 and spray the compressed cooling gas locally on a surface of a wafer 101. The inventive concept is not limited thereto. The third cooler 198 may compress the cooling gas and supply the cooling gas to the cooling gas gun 140, and the cooling gas gun 140 may spray the compressed cooling gas locally on the surface of the wafer 101.

To synchronize the cooling controller 190 with the inspection controller 180, the cooling controller 190 may receive an inspection control signal from the inspection controller 180, and the cooling controller 190 may transmit a cooling control signal to the inspection controller 180. The driving controller 192 may recognize the initialization of the inspection of a pattern on the wafer 101 based on the inspection control signal applied by the inspection controller 180.

The driving controller 192 may drive the first cooler 194 and the second cooler 196 before the inspection of the pattern on the wafer 101 begins. During the inspection of the pattern on the wafer 101, the driving controller 192 may drive the third cooler 198 before light is emitted by the light source 130.

As an example, the driving controller 192 may control the driving of the first cooler 194 based on a first temperature value applied by the first temperature sensor 170. The driving controller 192 may drive the first cooler 194 to cool the wafer chuck 120 to a preset temperature. The cooling air generated by the first cooler 194 may be supplied to the wafer chuck 120, and the wafer chuck 120 may be cooled to a preset temperature by the cooling air. The first cooler 194 may be driven within 10 minutes before the inspection of the pattern on the wafer 101 begins and cool the wafer chuck 120 to the preset temperature.

The driving controller 192 may continuously compare the first temperature value applied by the first temperature sensor 170 with the preset temperature of the wafer chuck 120. When a temperature of the wafer chuck 120 is lowered to the preset temperature (e.g., −10° C. to +10° C.), the driving controller 192 may control the driving of the first cooler 194 to maintain the preset temperature. The driving controller 192 may drive the first cooler 194 until the inspection of the pattern on the wafer 101 is completed and stop the driving of the first cooler 194 when the inspection of the pattern on the wafer 101 is completed.

As an example, the driving controller 192 may control the driving of the second cooler 196 based on a second temperature value applied by the second temperature sensor 175. The driving controller 192 may drive the second cooler 196 to cool the inside of the chamber to the preset temperature (e.g., −10° C. to +10° C.). The cooling air generated by the second cooler 196 may be supplied into the chamber 110, and the inside of the chamber 110 may be cooled to the preset temperature by the cooling air. The second cooler 196 may be driven within 10 minutes before the inspection of the pattern on the wafer 101 begins and cool the inside of the chamber 110 to the preset temperature.

The driving controller 192 may continuously compare the second temperature value applied by the second temperature sensor 175 with a preset inner temperature of the chamber 110. When the inner temperature of the chamber 110 is lowered to the preset temperature, the driving controller 192 may control the driving of the second cooler 196 to maintain the preset temperature. The driving controller 192 may drive the second cooler 196 until the inspection of the pattern on the wafer 101 is completed and stop the driving of the second cooler 196 when the inspection of the pattern on the wafer 101 is completed.

As an example, the driving controller 192 may control the driving of the third cooler 198 based on the inspection control signal applied to the inspection controller 180. The cooling gas generated by the third cooler 198 may be supplied to the cooling gas gun 140. A temperature of the surface of the wafer 101 may be lowered to a preset temperature (e.g., −10° C. or lower) by the cooling gas sprayed by the cooling gas gun 140.

As an example, before light is emitted by the light source 130 to the wafer 101, the cooling gas may be sprayed by the cooling gas gun 140 on the surface of the wafer 101. When light is emitted by the light source 130 to the wafer 101 and the cooling gas is sprayed by the cooling gas gun 140, light interference may occur due to the cooling gas. To prevent the light interference, the cooling gas may be sprayed locally by the cooling gas gun 140 on the surface of the wafer 101 five to ten seconds before light is emitted to the wafer 101. That is, after the cooling gas is sprayed by the cooling gas gun 140 on the surface of the wafer 101 five to ten seconds before light is emitted to the surface of the wafer 101, light may be emitted to the surface of the wafer 101 of which the temperature is lowered. As a result, a region irradiated with light may be cooled in advance to a temperature of −10° C. or lower so that the deformation of the wafer 101 and the PR due to heat may be prevented.

The driving controller 192 may drive the third cooler 198 until the inspection of the pattern on the wafer 101 is completed and stop the driving of the third cooler 198 when the inspection of the pattern on the wafer 101 is completed.

Figure 3:
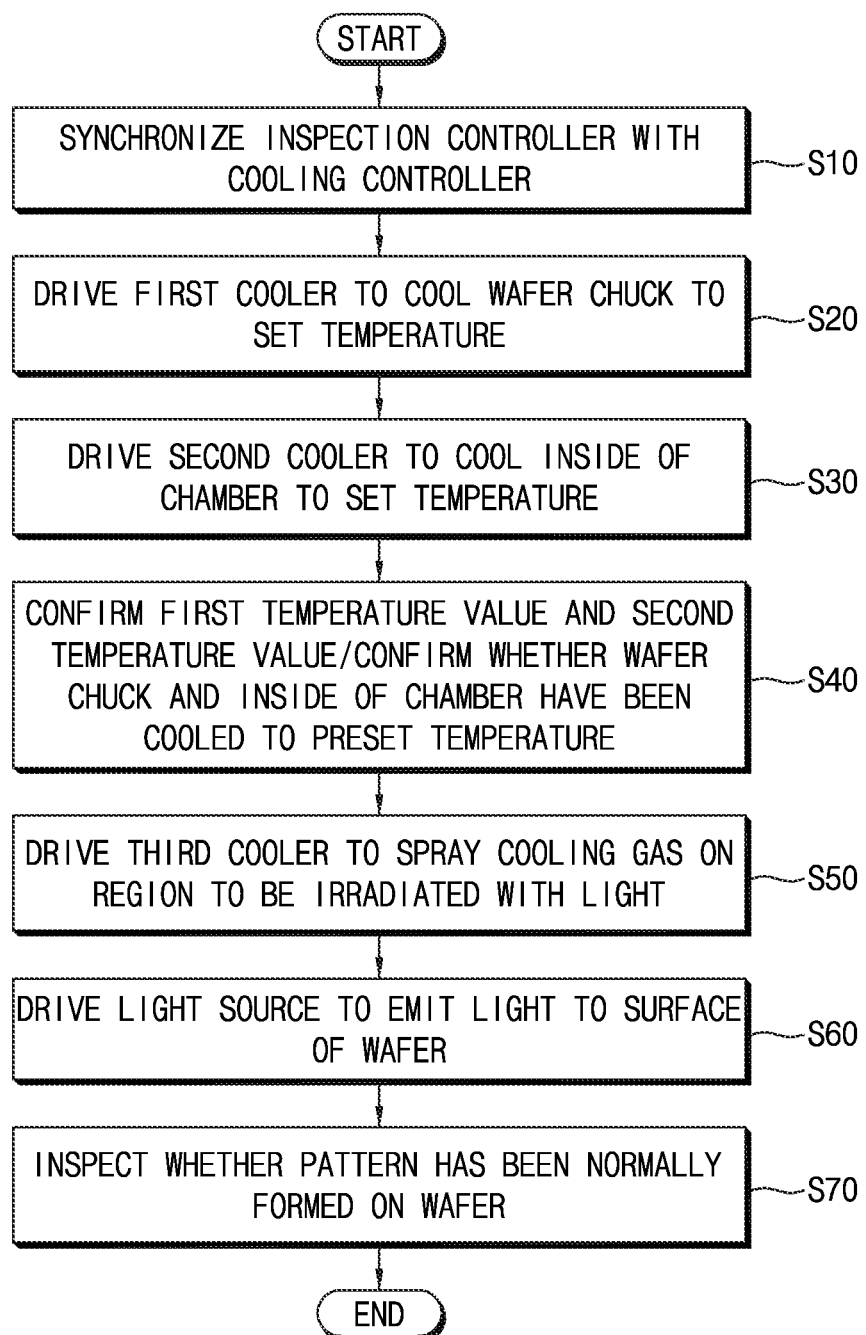
FIG. 3 is a flowchart illustrating a method of driving a semiconductor wafer inspection system according to an example embodiment of the inventive concept.

FIG. 3 is a flowchart illustrating a method of driving a semiconductor wafer inspection system according to an example embodiment of the inventive concept.

Figures 4, 5:
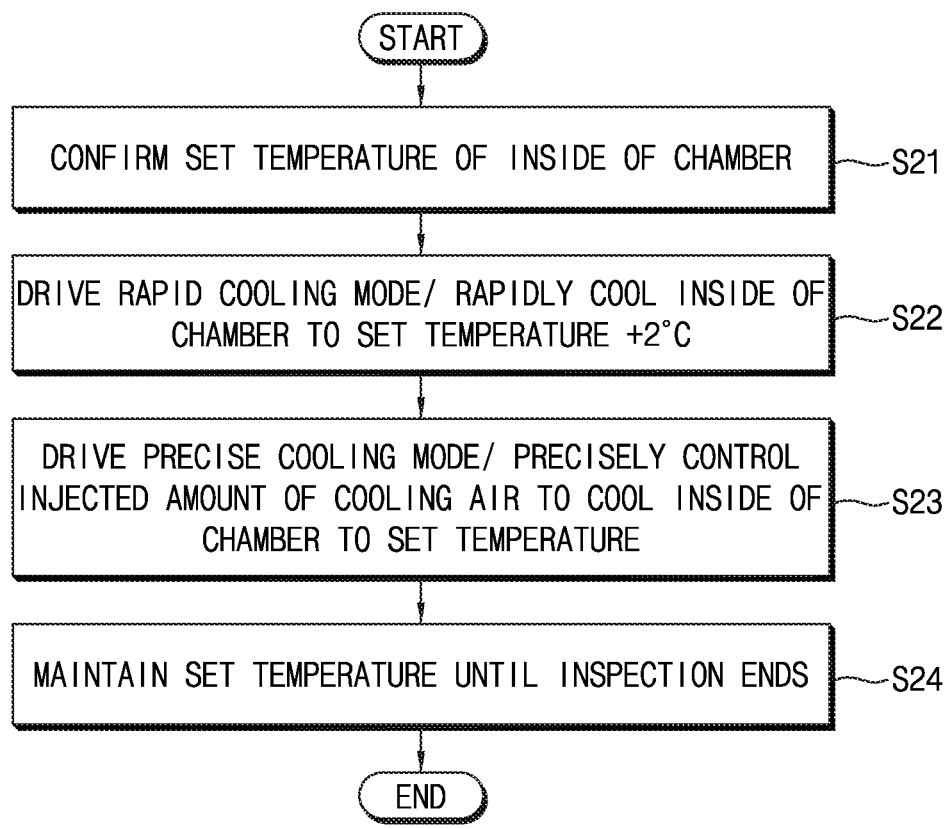
FIG. 4 is a table illustrating a method of cooling a wafer chuck, the inside of a chamber, and a surface of a wafer relative to a set temperature, according to an example embodiment of the inventive concept.
FIG. 5 is a flowchart illustrating a method of cooling a wafer chuck, according to an example embodiment of the inventive concept.

FIG. 4 is a table illustrating a method of cooling a wafer chuck, the inside of a chamber, and a surface of a wafer relative to a set temperature, according to an example embodiment of the inventive concept.

Referring to FIGS. 1 to 4, the inspection controller 180 and the cooling controller 190 may be synchronized with each other to inspect a pattern on a wafer. The inspection controller 180 and the cooling controller 190 may mutually transmit and receive control signals for synchronization and be synchronized with each other (S10).

As an example, the inspection controller 180 may generate an inspection control signal for inspecting a pattern of the wafer 101 and transmit the generated inspection control signal to the cooling controller 190. The cooling controller 190 may adjust a temperature of the wafer chuck 120 and an inner temperature of the chamber 110 to a preset temperature before the inspection of the pattern on the wafer 101 and generate a cooling control signal indicating whether a cooling condition has been satisfied. The cooling controller 190 may transmit the generated cooling control signal to the inspection controller 180.

The inspection controller 180 may start inspecting the pattern on the wafer 101 after the temperature of the wafer chuck 120 and the inner temperature of the chamber 110 are lowered to a preset temperature (e.g., −10° C. to +10° C.). The cooling controller 190 may drive the first cooler 194 and the second cooler 196 to cool the wafer chuck 120 and the inside of the chamber 110 to the preset temperature.

Thereafter, the driving controller 192 may drive the first cooler 194 to generate cooling air. The first cooler 194 may lower a temperature of CDA, which is a clean gas, and generate cooling air. The cooling air generated by the first cooler 194 may be supplied through a first supply line to a circulation line of the wafer chuck 120. The cooling air generated by the first cooler 194 may be supplied to the wafer chuck 120 so that the temperature of the wafer chuck 120 may be cooled to the preset temperature (e.g., −10° C. to +10° C.) (S20).

After the cooling air injected into the wafer chuck 120 is circulated by the circulation line, the cooling air may be exhausted by a first exhaust line to the first cooler 194.

Thereafter, the driving controller 192 may drive the second cooler 196 to generate cooling air. The second cooler 196 may lower a temperature of CDA, which is a clean gas, and generate the cooling air. The cooling air generated by the second cooler 196 may be supplied through a second supply line into the chamber 110. The cooling air generated by the second cooler 196 may be supplied into the chamber 110 and cool the inside of the chamber 110 to a preset temperature (e.g., −10° C. to +10° C.) (S30).

After the cooling air injected into the chamber 110 is circulated, the cooling air may be exhausted by a second exhaust line to the second cooler 196.

Thereafter, the cooling controller 190 may determine whether a temperature of the wafer chuck 120 has been lowered to the preset temperature (e.g., −10° C. to +10° C.) on the basis of a first temperature value applied by the first temperature sensor 170. The cooling controller 190 may determine whether the inside of the chamber 110 has been cooled to the preset temperature (e.g., −10° C. to +10° C.) on the basis of a second temperature value applied by the second temperature sensor 175. When the temperature of the wafer chuck 120 and an inner temperature of the chamber 110 are lowered to the preset temperature, the cooling controller 190 may transmit a temperature signal indicating the cooled state to the inspection controller 180 (S40).

Thereafter, during the inspection of the pattern on the wafer 101, the driving controller 192 may drive the third cooler 198 before light is emitted by the light source 130. The driving controller 192 may drive the third cooler 198 to generate a cooling gas. The cooling gas generated by the third cooler 198 may be supplied through a third supply line to the cooling gas gun 140. The cooling gas gun 140 may compress the cooling gas supplied by the third cooler 198 and spray the compressed cooling gas locally on the surface of the wafer 101.

A temperature of the surface of the wafer 101 may be lowered to the preset temperature (e.g., −10° C. or lower) due to the cooling gas sprayed by the cooling gas gun 140. When light is emitted by the light source 130 to the wafer 101 and the cooling gas is sprayed by the cooling gas gun 140, light interference may occur due to the cooling gas. To prevent the light interference, the cooling gas may be sprayed locally by the cooling gas gun 140 on the surface of the wafer 101 five to ten seconds before light is emitted to the wafer 101 (S50).

Next, after the temperature of the wafer chuck 120 and the inner temperature of the chamber 110 are lowered to the preset temperature, the inspection controller 180 may drive the transfer unit 160 and the light source 130. The inspection controller 180 may transmit a generated light source control signal to the light source 130. During the inspection of the wafer 101, the light source 130 may be driven based on the light source control signal applied by the inspection controller 180. Light may be emitted to the surface of the wafer 101 due to the driving of the light source 130. The light source 130 may be moved by the transfer unit 160 and emit light over the entire region of the wafer 101 (S60).

Thereafter, the vision camera 150 may generate an inspection image corresponding to the light emitted to the surface of the wafer 101. The vision camera 150 may transmit the generated inspection image to the inspection controller 180. The inspection controller 180 may display the inspection image, which is received from the vision camera 150, through a display device. The inspection controller 180 may determine whether the pattern has been normally formed on the surface of the wafer 101 based on the received inspection image and display a determination result. Thus, whether the pattern has been normally formed on the wafer 101 may be inspected (S70).

As the application of an extreme ultraviolet (EUV) pattern technique to a semiconductor manufacturing process has increased, failures caused by mask defects has become an important issue. In the semiconductor wafer inspection system and the method of driving the same, according to the example embodiments, the wafer chuck 120 and the inside of the chamber 110 may be cooled to a preset temperature (e.g., −10° C. to +10° C.) before the inspect of the pattern on the wafer 101 begins, and a cooling gas may be sprayed locally before light is emitted to the wafer 101. As a result, during an ADI process, the deformation of the wafer 101 and the PR due to the light emitted to the wafer 101 may be prevented to enhance failure detection performance.

FIG. 5 is a flowchart illustrating a method of cooling a wafer chuck, according to an example embodiment of the inventive concept.

Referring to FIGS. 1, 2, and 5, the cooling controller 190 may confirm a set temperature for cooling the wafer chuck 120 (S21).

Next, the driving controller 192 may drive the first cooler 194 to generate cooling air. To rapidly cool the wafer chuck 120, the driving controller 192 may drive the first cooler 194 in a rapid cooling mode. The driving controller 192 may confirm a first temperature value applied by the first temperature sensor 170 in real time and cool the first cooler 194 in a rapid cooling mode until the wafer chuck 120 is cooled to a target temperature (e.g., a preset temperature +2° C.). The target temperature may be set to a temperature (e.g., the preset temperature +2° C.) that is higher than the preset temperature by a predetermined temperature (S22).

The first cooler 194 may operate at full power in the rapid cooling mode to rapidly cool the air and generate a maximum amount of cooling air. The cooling air generated by the first cooler 194 may be supplied to the wafer chuck 120.

Thereafter, the driving controller 192 may drive the first cooler 194 in a precise cooling mode when the wafer chuck 120 is cooled to the target temperature (e.g., the preset temperature +2° C.). The first cooler 194 may operate at normal power in the precise cooling mode to cool the air and generate cooling air. The driving controller 192 may confirm the first temperature value applied by the first temperature sensor 170 in real time.

The driving controller 192 may drive the first cooler 194 in the precise cooling mode until the wafer chuck 120 is cooled to the preset temperature. The first cooler 194 may operate at normal power in the precise cooling mode and generate cooling air, and the cooling air generated by the first cooler 194 may be supplied to the wafer chuck 120. The cooling air generated by the first cooler 194 may be supplied to the wafer chuck 120 and cool the wafer chuck 120 to the preset temperature (S23).

Subsequently, the driving controller 192 may control the driving of the first cooler 194 so that a temperature of the wafer chuck 120 may be maintained at the preset temperature until the inspection of a pattern on the wafer 101 ends (S24).

Figure 6:
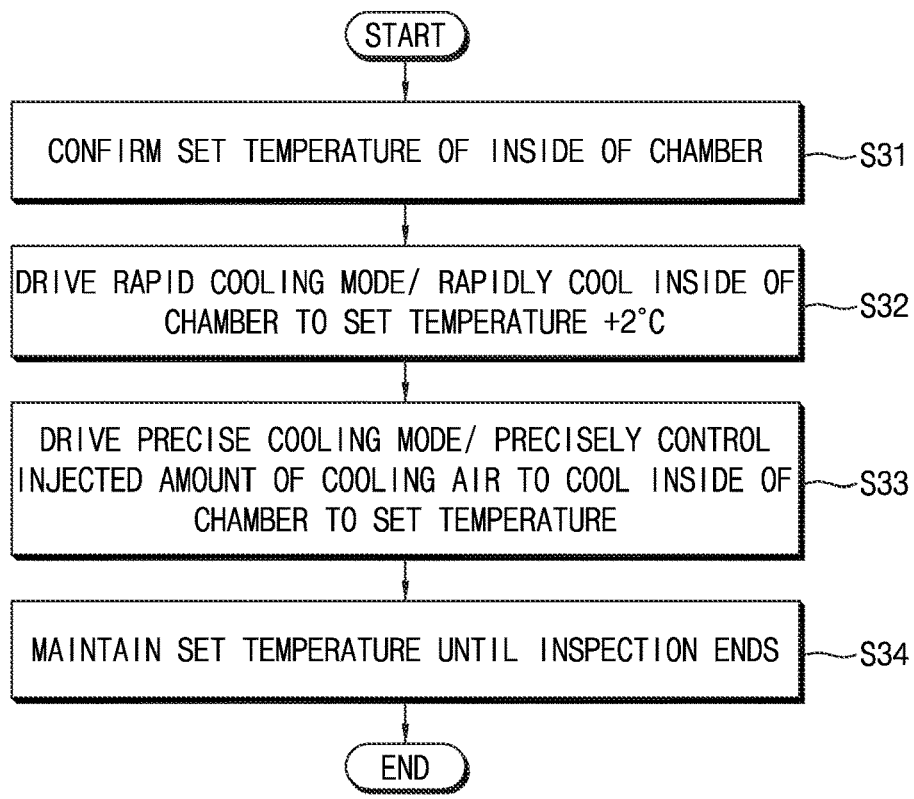
FIG. 6 is a flowchart illustrating a method of cooling the inside of a chamber, according to an example embodiment of the inventive concept.

FIG. 6 is a flowchart illustrating a method of cooling the inside of a chamber, according to an example embodiment of the inventive concept.

Referring to FIGS. 1, 2, and 6, the cooling controller 190 may confirm a set temperature for cooling the inside of the chamber 110 (S31).

Next, the driving controller 192 may drive the second cooler 196 to generate cooling air. To rapidly cool the inside of the chamber 110, the driving controller 192 may drive the second cooler 196 in a rapid cooling mode. The driving controller 192 may confirm a second temperature value applied by the second temperature sensor 175 in real time. The driving controller 192 may drive the second cooler 196 in the rapid cooling mode until the inside of the chamber 110 is cooled to a target temperature (e.g., a preset temperature +2° C.) (S32).

The second cooler 196 may operate at full power in the rapid cooling mode to rapidly cool the air and generate a maximum amount of cooling air. The cooling air generated by the second cooler 196 may be supplied into the chamber 110.

Thereafter, the driving controller 192 may drive the second cooler 196 in a precise cooling mode when the inside of the chamber 110 is cooled to the target temperature (e.g., preset temperature +2° C.). The target temperature may be set to a temperature (e.g., the preset temperature +2° C.) that is higher than the preset temperature by a predetermined temperature. In the precise cooling mode, a temperature and amount of cooling air may be finely adjusted. The second cooler 196 may operate at normal power in the precise cooling mode and generate cooling air, and the cooling air generated by the second cooler 196 may be supplied into the chamber 110.

The driving controller 192 may confirm the second temperature value applied by the second temperature sensor 175 in real time and drive the second cooler 196 in the precise cooling mode until the inside of the chamber 110 is cooled to the preset temperature. In the precise cooling mode, the temperature and amount of the cooling air may be finely adjusted. The second cooler 196 may operate at normal power in the precise cooling mode and generate the cooling air, and the cooling air generated by the second cooler 196 may be supplied to the wafer chuck 120. The cooling air generated by the second cooler 196 may be supplied into the chamber 110 to cool the inside of the chamber 110 to the preset temperature (S33).

Subsequently, the driving controller 192 may control the driving of the second cooler 196 so that an inner temperature of the chamber 110 may be maintained at the preset temperature until the inspection of a pattern on the wafer 101 ends (S34).

Figure 7:
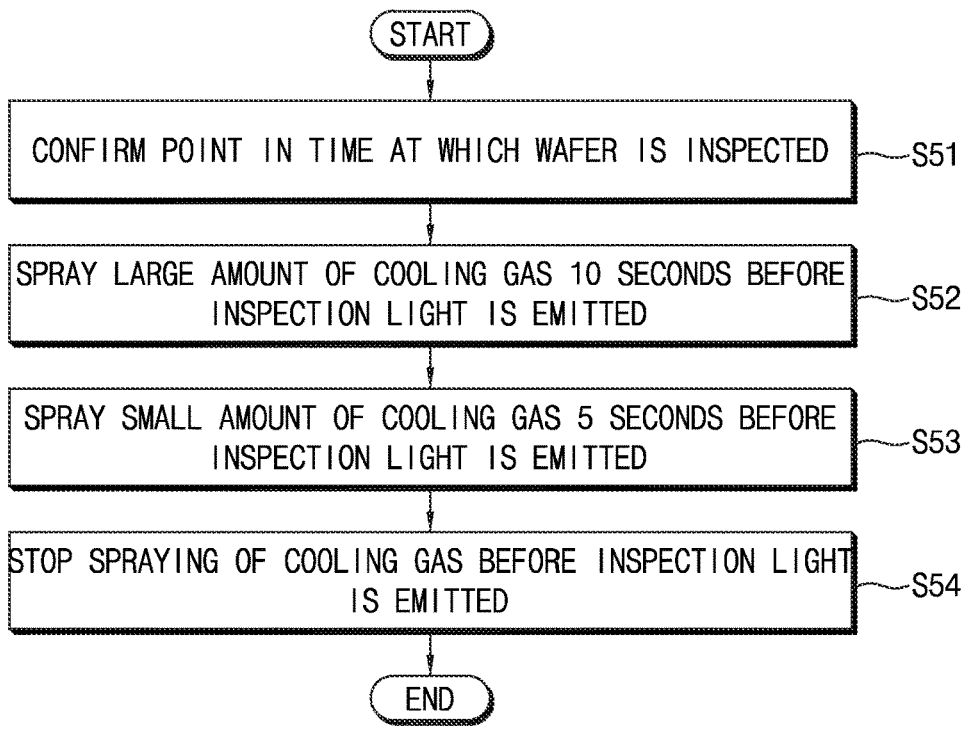
FIG. 7 is a flowchart illustrating a method of cooling a surface of a wafer using a cooling gas gun, according to an example embodiment of the inventive concept.

FIG. 7 is a flowchart illustrating a method of cooling a surface of a wafer using a cooling gas gun, according to an example embodiment of the inventive concept.

Referring to FIGS. 1, 2, and 7, the cooling controller 190 may confirm a point in time at which a wafer is inspected based on an inspection control signal received from the inspection controller 180 (S51).

Thereafter, during the inspection of a pattern, before light is emitted to the wafer 101, the driving controller 192 may drive the third cooler 198 to generate a cooling gas. The third cooler 198 may supply the generated cooling gas to the cooling gas gun 140. The cooling gas gun 140 may compress the cooling gas supplied by the third cooler 198 and spray the compressed cooling gas locally on the surface of the wafer 101. A temperature of the surface of the wafer 101 may be lowered to a preset temperature (e.g., −10° C. or lower) by the cooling gas sprayed by the cooling gas gun 140.

Specifically, when light is emitted by the light source 130 to the wafer 101 and the cooling gas is sprayed by the cooling gas gun 140, light interference may occur due to the cooling gas. To prevent light interference, a large amount of cooling gas may be sprayed locally by the cooling gas gun 140 on the surface of the wafer 101 at a first point in time before light is emitted to the wafer 101 (e.g., ten seconds before light is emitted to the wafer 101) (S52).

The large amount of cooling gas may be sprayed on the surface of the wafer 101 so that the surface of the wafer 10 may be rapidly cooled to the preset temperature (e.g., −10° C. or lower).

Subsequently, to prevent light interference, a small amount of cooling gas may be sprayed locally by the cooling gas gun 140 on the surface of the wafer 101 at a second point in time before light is emitted to the wafer 101 (e.g., five seconds before light is emitted to the wafer 101) (S53).

After the surface of the wafer 101 is rapidly cooled by spraying the large amount of cooling gas on the surface of the wafer 101 in operation S52, the small amount of cooling gas may be sprayed on the surface of the wafer 101 in operation S53 to maintain a temperature of the surface of the wafer 101.

Thereafter, before inspection light is emitted to the surface of the wafer 101, the driving controller 192 may stop the driving of the third cooler 198 and stop the spraying of the cooling gas (S54).

As described above, after the cooling gas is sprayed on the surface of the wafer 101 by the cooling gas gun 140 five to ten seconds before light is emitted to the surface of the wafer 101, light may be emitted to the surface of the wafer 101 of which the temperature is lowered. Thus, a region irradiated with light may be cooled in advance to a temperature of −10° C. or lower so that the deformation of the wafer 101 and the PR due to heat may be prevented.

The driving controller 192 may drive the third cooler 198 until the inspection of the pattern on the wafer 101 is completed and stop the driving of the third cooler 198 when the inspection of the pattern on the wafer 101 is completed. That is, after the cooling gas gun 140 stops spraying the cooling gas, the light source 130 may be driven to emit light to the surface of the wafer 101.

In the semiconductor wafer inspection system and the method of driving the same, according to the example embodiments, the wafer chuck 120 and the inside of the chamber 110 may be cooled to the preset temperature (e.g., −10° C. to +10° C.) before the inspection of the pattern on the wafer 101 begins, and the cooling gas may be sprayed locally before light is emitted to the wafer 101. Thus, during an ADI process, the deformation of the wafer 101 and the PR due to the light emitted to the wafer 101 may be prevented to enhance failure detection performance.

According to the example embodiments of the inventive concept, a semiconductor wafer cooling system and a method of driving the same can prevent the deformation of a wafer and the PR due to light emitted to the wafer during an ADI process and improve failure detection performance.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:

1. A semiconductor wafer inspection system comprising:
   a wafer chuck disposed inside a chamber and on which a wafer is disposed;
   a light source configured to emit light to the wafer so as to inspect a pattern on the wafer;
   an inspection controller configured to control driving of the light source;
   a cooling gas gun disposed adjacent to the light source and configured to spray a cooling gas on a surface of the wafer;
   a temperature sensor configured to measure a temperature of the wafer chuck, generate a temperature value, and transmit the temperature value to a cooling controller; and
   the cooling controller comprising:
      a first cooler configured to generate and supply cooling air to the wafer chuck before light is emitted to the wafer;
      a second cooler configured to generate and supply the cooling gas to the cooling gas gun; and
      a driving controller configured to control driving of the first cooler based on the temperature of the wafer chuck and control driving of the second cooler based on a point in time at which light is emitted to the wafer.

2. The semiconductor wafer inspection system of claim 1, wherein the driving controller drives the first cooler to cool the wafer chuck to a preset temperature.

3. The semiconductor wafer inspection system of claim 2, wherein the cooling controller confirms the temperature value of the wafer chuck in real time and maintains the temperature of the wafer chuck at the preset temperature until the inspection of the pattern on the wafer ends.

4. The semiconductor wafer inspection system of claim 1, wherein the cooling gas gun sprays the cooling gas locally on the surface of the wafer to be irradiated with light before the light is emitted to the wafer.

5. The semiconductor wafer inspection system of claim 4, wherein the light source emits light to the surface of the wafer so as to inspect the pattern after the cooling gas is sprayed on the surface of the wafer.

6. A semiconductor wafer inspection system comprising:
   a wafer chuck disposed inside a chamber and on which a wafer is disposed;
   a light source configured to emit light to the wafer so as to inspect a pattern on the wafer;
   an inspection controller configured to control driving of the light source;
   a cooling gas gun disposed adjacent to the light source and configured to spray a cooling gas on a surface of the wafer;
   a temperature sensor configured to measure an inner temperature of the chamber, generate a temperature value, and transmit the temperature value to a cooling controller; and
   the cooling controller comprising:
      a first cooler configured to generate and supply cooling air to an inside of the chamber;
      a second cooler configured to generate and supply the cooling gas to the cooling gas gun before light is emitted to the wafer; and
      a driving controller configured to control driving of the first cooler based on the inner temperature of the chamber and control driving of the second cooler based on a point in time at which light is emitted to the wafer.

7. The semiconductor wafer inspection system of claim 6, wherein the driving controller drives the first cooler to cool the inside of the chamber to a preset temperature.

8. The semiconductor wafer inspection system of claim 7, wherein the cooling controller confirms the temperature value of the inside of the chamber in real time and maintains the inner temperature of the chamber at the preset temperature until the inspection of the pattern on the wafer ends.

9. The semiconductor wafer inspection system of claim 6, wherein the cooling gas gun sprays the cooling gas locally on the surface of the wafer to be irradiated with light before the light is emitted to the wafer.

10. The semiconductor wafer inspection system of claim 9, wherein the light source emits light to the surface of the wafer so as to inspect the pattern after the cooling gas is sprayed on the surface of the wafer.

11. A semiconductor wafer inspection system comprising:
    a wafer chuck disposed inside a chamber and on which a wafer is disposed;
    a light source configured to emit light to the wafer so as to inspect a pattern on the wafer;
    an inspection controller configured to control driving of the light source;
    a cooling gas gun disposed adjacent to the light source and configured to spray a cooling gas on a surface of the wafer;
    a cooling controller configured to supply cooling air to the wafer chuck and an inside of the chamber and supply a cooling gas to the cooling gas gun before light is emitted to the wafer;
    a first temperature sensor configured to measure a temperature of the wafer chuck, generate a first temperature value, and transmit the first temperature value to the cooling controller; and
    a second temperature sensor configured to measure an inner temperature of the chamber, generate a second temperature value, and transmit the second temperature value to the cooling controller.

12. The semiconductor wafer inspection system of claim 11, wherein the cooling controller comprises:
    a first cooler configured to generate the cooling air to be supplied to the wafer chuck;
    a second cooler configured to generate the cooling air to be supplied to the inside of the chamber;
    a third cooler configured to generate the cooling gas to be supplied to the cooling gas gun; and
    a driving controller configured to control driving of the first cooler based on the first temperature value, control driving of the second cooler based on the second temperature value, and control driving of the third cooler based on a point in time at which light is emitted to the wafer.

13. The semiconductor wafer inspection system of claim 12, wherein the driving controller drives the first cooler to cool the wafer chuck to a preset temperature and drives the second cooler to cool the inside of the chamber to the preset temperature.

14. The semiconductor wafer inspection system of claim 13, wherein the driving controller drives the first cooler at full power until the temperature of the wafer chuck reaches a target temperature, which is higher than the preset temperature by a predetermined temperature, and drives the first cooler at normal power when the temperature of the wafer chuck reaches the target temperature.

15. The semiconductor wafer inspection system of claim 13, wherein the driving controller drives the second cooler at full power until the inner temperature of the chamber reaches a target temperature, которая is higher than the preset temperature by a predetermined temperature, and drives the second cooler at normal power when the inner temperature of the chamber reaches the target temperature.

16. The semiconductor wafer inspection system of claim 12, wherein the cooling gas gun sprays the cooling gas locally on the surface of the wafer to be irradiated with the light before the light is emitted to the wafer.

* * * * *